United States Patent [19]

Yano et al.

[11] Patent Number: 5,189,588
[45] Date of Patent: Feb. 23, 1993

[54] SURGE PROTECTION APPARATUS

[75] Inventors: Shigeru Yano; Masao Takiguchi, both of Takatsuki, Japan

[73] Assignee: Matsushita Electric Industrial Co., Ltd., Osaka, Japan

[21] Appl. No.: 493,684

[22] Filed: Mar. 15, 1990

[30] Foreign Application Priority Data

Mar. 15, 1989 [JP] Japan .................................. 1-60864

[51] Int. Cl.⁵ ............................................. H02H 9/04
[52] U.S. Cl. ......................................... 361/56; 361/91
[58] Field of Search ........................ 361/56, 58, 91, 111

[56] References Cited

U.S. PATENT DOCUMENTS

| | | | |
|---|---|---|---|
| 3,777,216 | 12/1973 | Armstrong | 361/111 |
| 4,066,918 | 1/1978 | Heuner et al. | 361/91 |
| 4,423,431 | 12/1983 | Sasaki | 361/56 |
| 4,630,162 | 12/1986 | Bell et al. | 361/56 |
| 4,736,271 | 4/1988 | Mack et al. | 361/91 |

FOREIGN PATENT DOCUMENTS 2090701 7/1982 United Kingdom .

Primary Examiner—Todd E. DeBoer
Attorney, Agent, or Firm—Wenderoth, Lind & Ponack

[57] ABSTRACT

A surge protection apparatus, has a signal terminal, and first and second power supply terminals which are connected to the internal circuit to be protected, and first and second diodes which are connected between the signal terminal and the first and second power supply terminals, and a protective transistor acting as a discharge path for the surge voltage which is connected between the first and the second power supply terminals. As a result, even if the discharge capability of the internal circuit connected between the first and second power supply terminals is small, the surge voltage can be discharged in a short time through the protective transistor. Moreover, since the protective diode at the positive power supply side is connected to the power source of low impedance, the plural signal terminals will not be coupled by the junction capacitance. Thus, crosstalk does not occur between the plural signal terminals.

3 Claims, 7 Drawing Sheets

SURGE PROTECTION APPARATUS

BACKGROUND OF THE INVENTION

The present invention relates to a surge protection apparatus for preventing electrostatic breakdown of an electronic function circuit.

FIG. 10 shows a conventional example of a surge protection apparatus. This is an equivalent circuit diagram of the surge protection apparatus disclosed in Japanese Laid-open Patent No. 58-159370.

In FIG. 10, plural (two, in this example) signal terminals 2 and 3, and a pair of power supply terminals 4 and 5 are connected to an internal circuit 1. Between the two signal terminals 2 and 3 and the negative (or zero volt) power supply terminal 5, diodes 6 and 7 for discharging the negative electric charge are connected in the direction shown. On the other hand, between the signal terminals 2 and 3 and the power supply terminal 5, a positive charge protective circuit 8 for discharging the positive electric charge is connected. The positive charge protective circuit 8 comprises diodes 9 and 10 connected to the signal terminals 2 and 3, and a transistor 11 those collector is connected to the cathodes of the diodes 9 and 10, and whose emitter is connected to the power supply terminal 5, and whose base is open.

The operation of the surge protection apparatus in FIG. 10 is as follows.

While the input voltage applied to the signal terminals 2 and 3 are within a range of operating voltage of the internal circuit 1, the transistor 11 is in its cut-off state, and the positive charge protective circuit 8 is at a high impedance. The diodes 6 and 7 are also in then cut-off state and are at a high impedance. Accordingly, the surge protection apparatus does not operate at all, and the voltages applied to the signal terminals 2 and 3 are directly supplied to the internal circuit 1, and ordinary signal processing is done.

When, due to some reason or other, negative high voltages are applied to the signal terminals 2 and 3, the diodes 6 and 7 are made to conduct. Accordingly, the negative high voltages are applied via bypass to the power supply terminal 5 through the diodes 6 and 7. As a result, breakdown of the internal circuit 1 due to negative high voltages will be prevented.

To the contrary, when positive high voltages exceeding the tolerance of the transistor 11 are applied to the signal terminals 2 and 3, the transistor 11 breaks down at $BV_{CEO}$ (the breakdown voltage between the collector and emitter with the base open). Consequently, the input voltages at the signal terminals 2 and 3 are clamped at $BV_{CEO}$. Thus, by limiting the input voltages applied to the signal terminals 2 and 3 by the positive charge protective circuit 8, the internal circuit 1 may be protected from the breakdown due to positive static electricity.

FIG. 12 shows another example of a conventional surge protection apparatus. This is the surge protection apparatus disclosed in Japanese Patent Publication No. 48-30189.

In FIG. 12, a signal terminal 12 and a pair of power supply terminals 4 and 5 are connected to an internal circuit 1. Between the signal terminal 12 and the positive power supply terminal 4, a diode 13 for discharging the positive electric charge in the polarity shown is connected. On the other hand, between the signal terminal 12 and the negative (or zero volt) power supply terminal 5, a diode 14 for discharging the negative electric charge in the polarity shown is connected.

The operation of the surge protection apparatus in FIG. 12 is described below.

While the input voltage applied to the signal terminal 12 is within a range of supply voltage, the diodes 13 and 14 are both in their cut-off state and are at a high impedance. Accordingly, the surge protection apparatus does not operate at all, and the input voltage applied to the signal terminal 12 is directly supplied into the internal circuit 1, and ordinary signal processing is done.

On the other hand, due to some reason or other, if a positive high voltage exceeding the supply voltage is applied to the signal terminal 12, the diode 13 is made to conduct, and the input voltage applied to the signal terminal 12 is clamped. To the contrary, when a negative high voltage exceeding the supply voltage is applied to the signal terminal 12, the diode 14 is made to conduct, and the input voltage applied to the signal terminal 12 is clamped.

The surge protection apparatus shown in FIG. 12 protects the internal circuit 1 from breakdown due to surge voltage in this way.

The conventional surge protection apparatus shown in FIG. 10 and FIG. 12, however, have the following problems.

In the surge protection apparatus in FIG. 10, in actual use, that is, when a supply voltage is applied to a pair of power supply terminals 4 and 5 and input voltages not exceeding the supply voltage are applied to the plural signal terminals 2 and 3, the diodes 9 and 10 and transistor 11 do not conduct. In such an input condition, the equivalent circuit in FIG. 10 becomes as shown in FIG. 11. More specifically, the diodes 9, and 10 are replaced by the electrostatic capacities 15 and 16, and the transistor 11 by the parallel circuit of collector resistance 17 and electrostatic capacity 18 between collector and emitter. When such surge protection apparatus is applied to the input part of the circuit processing high frequency signals or switching signals, such as high frequency amplifiers and switching circuits, the electrostatic capacities 15 and 16 are a set at low impedance in the high frequency region of the input signal. Accordingly, the plural signal terminals 2 and 3 are coupled through the low-impedance electrostatic capacities 15 and 16, and the input signal applied to one signal terminal 2 is mixed into the other signal terminal 3, thereby generating a so-called crosstalk. This crosstalk occurs not only in high frequency amplifier and switching circuits but also in high input impedance circuits or high gain circuits even in a low frequency amplifier.

In the surge protection apparatus in FIG. 12, electrostatic capacity is not present between the signal terminal 12 and the other signal terminal. Therefore, in actual use, the crosstalk as experienced in the surge protection apparatus in FIG. 10 does not occur. In the surge protection apparatus in FIG. 12, however, since the junction capacitance of the diodes 13 and 14 is applied between the signal terminal 12 and the pair of power supply terminals 4 and 5, the high frequency characteristic of the electronic function circuit deteriorates.

Generally, moreover, the environments for inducing the electrostatic breakdown of a semiconductor integrated circuit (called an IC hereinafter) incorporating electronic function circuits are:

1. when the IC is put in a magazine and is conveyed, and 2. when the IC is built into an electronic device, among others, and in these circumstances, anyway, friction is applied to the IC from its outside. In such environments, the surge voltage applied to the signal terminal 12 of the IC incorporating the surge protection apparatus in FIG. 12 is discharged through the impedance in the internal circuit 1, or the impedance (in the internal circuit 1, or the impedance) between the pair of power supply terminals 4 and 5. Accordingly, in the surge protection apparatus in FIG. 12, the effect of the surge protection (the discharge capability) varies depending on the magnitude of the impedance between the power supply terminals 4 and 5. For example, in the IC with a small degree of integration, generally, the current consumption is small, and the internal direct-current resistance between the power supply terminals 4 and 5 is large. Furthermore, since the junction area of the resistance element or transistor element formed in one semiconductor substrate is small, the equivalent junction area between the power supply terminals 4 and 5 becomes consequently small. When a positive static electricity is applied to the signal terminal 12 of such an IC with a small degree of integration, the positive charge flows into the internal circuit 1 by way of the diode 13. However since the impedance between the power supply terminals 4 and 5 is large, in other words, the electric charge absorbing capability is weak, the voltage between the power supply terminals 4 and 5 is likely to go up, and a high voltage is maintained for a long period. This tendency appears more significantly when the IC has a large internal impedance between the power supply terminals 4 and 5, and the probability of breaking down the IC by static electricity is raised.

Meanwhile, in the conventional surge protection apparatus shown in FIG. 10, since the discharge route of positive charge is formed by the breakdown voltage $BV_{CEO}$ of the transistor 11, a favorable surge protective effect is obtained regardless of the impedance between the power supply terminals 14 and 15.

Thus, the two surge protection apparatuses shown in FIG. 10, FIG. 12 have their own merits and demerits. Therefore, the designers of ICs were forced to select the surge protective apparatus estimated to be the best for each IC in consideration of the application of IC and the degree of integration of the circuit elements. The criterion is, at the present, dependent on the intuition of the designers on the basis of the past experience.

In this background there is a growing demand for the development of general-purpose surge protection apparatus applicable to any design specification of IC. The present invention is intended to present a surge protection apparatus meeting such a demand.

SUMMARY OF THE INVENTION

It is hence a first object of the invention to present a surge protection apparatus which does not generate crosstalk between signal terminals.

It is a second object of the invention to present a surge protection apparatus capable of always obtaining a stable discharge capability regardless of the degree of integration of the internal circuit of the IC.

Other objects of the invention will be clarified in the following detailed description taken in conjunction with the accompanying drawings.

Summing up the invention, a signal terminal, and first and second power supply terminals are connected to an internal circuit which is to be protected, first and second diodes are connected between the signal terminal and the first and second power supply terminals, and a protective transistor acting as the discharge path for the surge current is connected between the first and second power supply terminals.

If the discharge capability of the internal circuit connected between the first and second power supply terminals is small, the surge voltage may be discharged in a short time through the protective transistor.

Accordingly, a particularly prominent effect will be obtained when applied to the IC having a weak discharge capability in the internal circuit, such as the cases of an IC having a plurality of divided power supply terminals, an IC with low current consumption, and an IC with a small number of elements.

Besides, by this invention, since the protective diode at the positive power supply side is connected to the power source of low impedance, the plural signal terminals will not be coupled by junction capacitance. Hence, crosstalk will not occur between the plural signal terminals.

Thus employing the surge protection apparatus of the present invention, a stable surge protective function may be always obtained regardless of the design specification of the IC (for example, the discharge capability of the internal circuit), so that a surge protection apparatus of an extremely wide versatility will be presented.

DETAILED DESCRIPTION OF THE INVENTION

Figure 1:
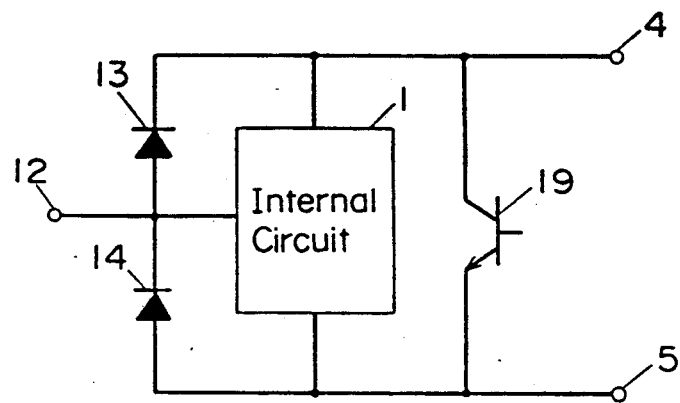
FIG. 1 is a circuit diagram showing a surge protection apparatus in accordance with a first embodiment of the present invention.

Referring now to the drawings, some of the embodiments of the present surge protection circuit of the invention are described in detail below.

FIG. 1 is a circuit diagram of a surge protection apparatus in accordance with a first embodiment of the present invention. In FIG. 1, a signal terminal 12 and a pair of power supply terminals 4 and 5 are connected to an internal circuit 1. The signal terminal 12 may be either the signal input terminal to which the input signal to the internal circuit 1 is applied, or the signal output terminal to which the signal from the internal circuit 1 is delivered. Between the signal terminal 12 and the positive power supply terminal 4, a first diode 13 for discharging the positive electric charge is connected in the shown polarity. Between the signal terminal 12 and the negative (or zero volt) power supply terminal 5, a second diode 14 for discharging the negative electric charge is connected in the shown polarity. This composition is same as that of the conventional surge protection apparatus shown in FIG. 12. What is characteristic in FIG. 1 is that a protective transistor 19 is connected between the pair of power supply terminals 4 and 5. The collector of the protective transistor 19 is connected to the positive power supply terminal 4, and the emitter is connected to the negative power supply terminal 5, while the base is open.

The operation of the surge protection apparatus in FIG. 1 is described below.

While the input voltage applied to the signal terminal 12 is within a range of the supply voltage, both the first and second diodes 13 and 14 are in their cut-off state and are at a high impedance. Accordingly, the surge protection apparatus does not operate at all, and the input voltage applied to the signal terminal 12 is directly supplied into the internal circuit 1, and ordinary signal processing is made.

On the other hand, due to some reason or other, if a negative high voltage exceeding the supply voltage is applied to the signal terminal 12, the second diode 14 is made to conduct. Consequently the voltage at the signal terminal 12 is clamped at the forward diode voltage (about 0.7 V). As a result, breakdown of the internal circuit 1 by the negative high voltage is avoided.

Figure 12:
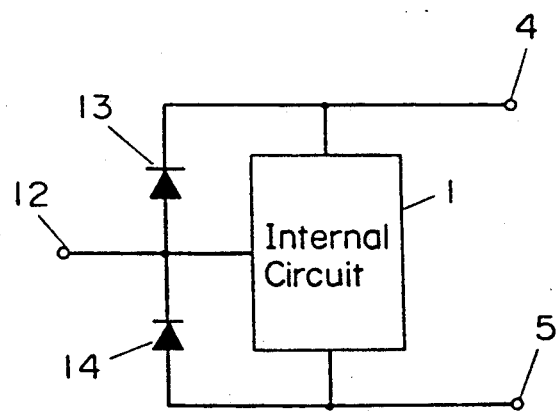
FIG. 12 is a circuit diagram of another conventional surge protection apparatus.

So far, the ordinary operation and the operation upon application of negative high voltage are same as in the conventional surge protection apparatus shown in FIG. 12.

Next, when a positive high voltage exceeding the supply voltage is applied to the signal terminal 12, the first diode 13 is made to conduct, and the potential of the positive power supply terminal 4 is raised. Sequentially, when the potential of the positive power supply terminal 4 reaches $BV_{CEO}$ (the breakdown voltage between the collector and emitter with the base open) of the protective transistor 19, the protective transistor 19 breaks down, and the impedance becomes low between the positive power supply terminal 4 and the nagative power supply terminal 5. Thus, the breakdown of the internal circuit 1 due to the positive high voltage applied to the signal terminal 12 is prevented.

Usually, the discharge capability of the protective transistor 19 is more than ten times as high as that of the internal circuit 1. Therefore, according to the embodiment in FIG. 1, as compared with the conventional surge protection apparatus in FIG. 12, the discharge time of the positive electric charge may be notably shortened. In particular, when a transistor having a large current capacity is used as the protective transistor 19, the positive charge may be discharged in a much shorter time. As a result, even in a higher voltage (the voltage determined by the breakdown voltage $BV_{CEO}$ between the collector and emitter of the protective transistor 19, usually about 20 V) than the breakdown voltage $BV_{BEO}$ (usually about 5 V) between the base and emitter of the transistor for composing the internal circuit 1 is applied, the positive electric charge is discharged in an extremely short time, so that the internal circuit 1 may be perfectly protected from being destroyed by the Joule heat.

Figure 2:
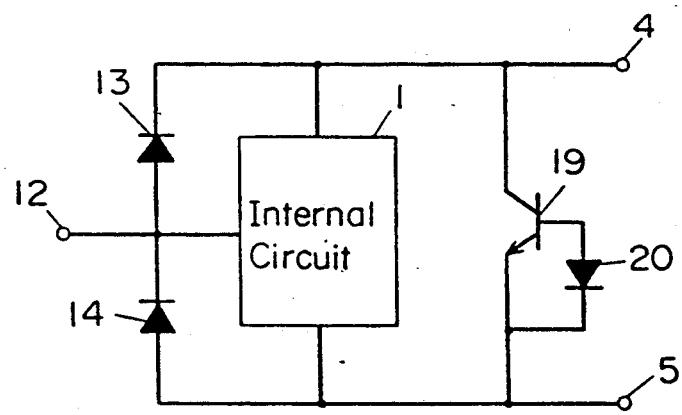
FIG. 2 is a circuit diagram showing a surge protection apparatus in accordance with a second embodiment of the invention.

FIG. 2 is a circuit diagram of a surge protection apparatus in accordance with a second embodiment of the present invention. The same parts as in FIG. 1 are identified with same reference numbers. What is different from FIG. 1 is that a diode 20 is connected between the base and emitter of the protective transistor 19.

In the constitution in FIG. 1, a leakage current $I_{CBO}$ between the collector and base flows in the protective transistor 19. This leakage current acts as a kind of base current. As a result, between the collector and emitter of the protective transistor 19, a collector current ($I_{CBO} \times hfe$) flows. [hfe is the forward-current transfer ratio (common-emitter) of the protective transistor 19.] The collector currecnt varies depending on the fluctuation of the direct current amplification factor hfe.

In the embodiment in FIG. 2, meanwhile, the diode 20 is connected between the base and emitter of the protective transistor 19 to suppress the fluctuation of the collector current due to the forward-current transfer ratio hfe. In particular, when the diode 20 is composed of a diode-connected transistor having the same shape as the protective transistor 19, the collector current of the protective transistor 19 may be held at about double the leakage current $I_{CBO}$.

Figure 3:
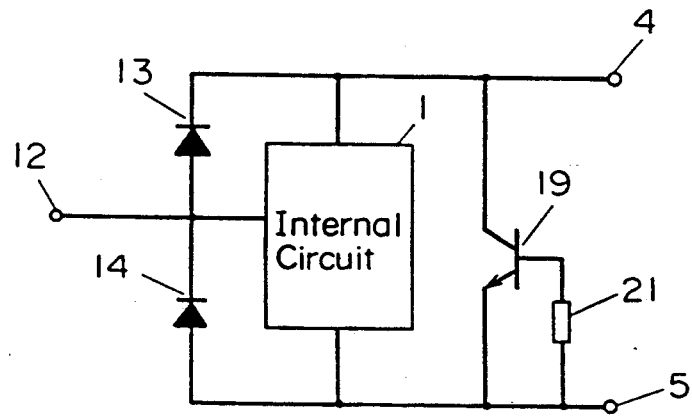
FIG. 3 is a circuit diagram showing a surge protection apparatus in accordance with a third embodiment of the present invention.

FIG. 3 is a circuit diagram showing a surge protection apparatus according a third embodiment of the present invention. In FIG. 3, too, the same parts as in FIG. 1 are identified with same reference numbers. What is different from FIG. 1 is that a resistance element 21 is connected between the base and emitter of the protective transistor 19.

Supposing the resistance value of the resistance element 21 to be R, if within a range of $$I_{CBO} \times R \leq 0.7 \; V \tag{1}$$

only a collector current equivalent to the leakage current $I_{CBO}$ flows in the collector of the protective transistor 19. Accordingly, the fluctuation of the collector current may be suppressed.

Figure 4:
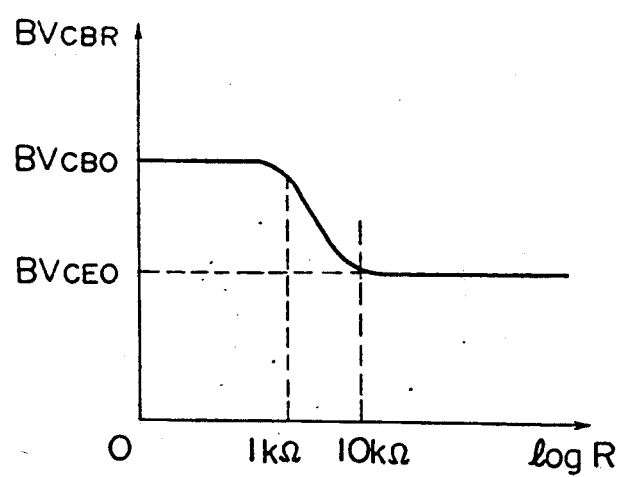
FIG. 4 is a characteristic diagram showing the relationship between the resistance value of the resistance element in FIG. 3 and the breakdown voltage of the protective transistor.

FIG. 4 shows the changes of the breakdown voltage $BV_{CER}$ of the protective transistor 19 when the resistance value R of the resistance element 21 is varied. As evident from FIG. 4, the breakdown voltage $BV_{CBR}$ of the protective transistor 19 changes within a range from $BV_{CBO}$ (the breakdown voltage between the collector and base with the emitter open) to $BV_{CEO}$ (the breakdown voltage between the collector and emitter with the base open), depending on the variations of the resistance value R. When the resistance value is set at a small value so as to satisfy equation (1) as stated above the collector current may be kept at about the leakage current, but as clear from FIG. 4, in this case, the breakdown voltage of the protective transistor 19 is high, and the surge protective effect is lowered accordingly. It is hence desired to set the resistance value R of the resistance element 21 at a proper value capable of inhibiting the effect of the leakage current and also suppressing the increase of the breakdown voltage. Generally, a resistance element of several thousand ohms or more may be used.

Figure 5:
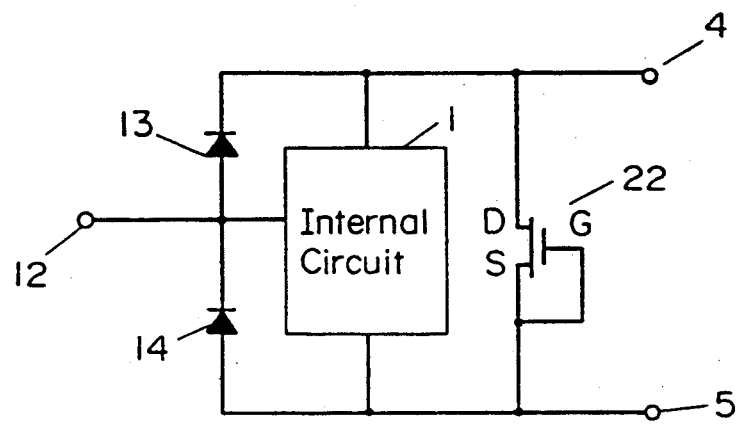
FIG. 5 is a circuit diagram showing a surge protection apparatus in accordance with a fourth embodiment of the present invention.

FIG. 5 is a circuit diagram of a surge protection apparatus in accordance with a fourth embodiment of the present invention. In the embodiment shown in FIG. 5, a protective transistor 22 composed of as MOS transistor is connected between a pair of power supply terminals 4 and 5. That is, the drain D of the protective transistor 22 is connected to the positive power supply terminal 4, and the source S and gate G are connected to the negative power supply terminal 5.

The internal circuit 1 is thus protected by the breakdown voltage of the MOS transistor 22. What is more, when the internal circuit 1 is of an MOS transistor, the correlation of the breakdown voltage between the transistors in the internal circuit 1 and the protective transistor 22 may be achieved, so that the optimum protective circuit may always be composed in the internal circuit 1 regardless of the fluctuations of the process parameters.

Figure 6:
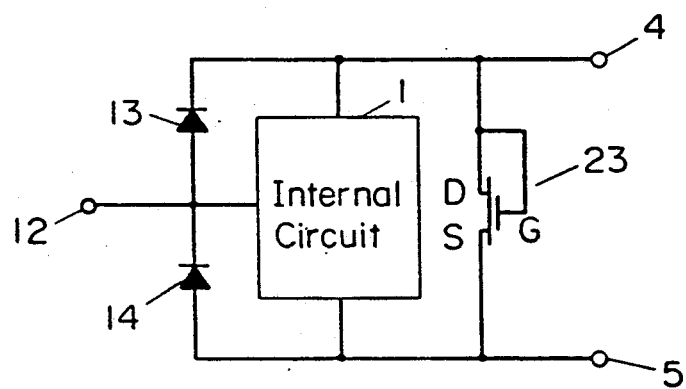
FIG. 6 is a circuit diagram showing a surge protection apparatus in accordance with a fifth embodiment of the present invention.

FIG. 6 is a circuit diagram of a surge protection apparatus in accordance with a fifth embodiment of the present invention. In the embodiment in FIG. 6, a MOS diode 23 uses a MOS transistor have an larger threshold voltage $V_T$ than the threshold voltage $V_T$ of the MOS transistor for composing the internal circuit 1, and the MOS diode 23 is connected between a pair of power supply terminals 4 and 5. That is, by connecting between the gate G and drain D of the MOS transistor, the MOS diode 23 is composed, and its drain D is connected to the power supply terminal 4, while the source 5 is connected to the negative power supply terminal 5.

In this constitution, by the threshold voltage $V_T$ of the MOS diode 23, a discharge path is formed between the power supply terminals 4 and 5, so that the voltage of the signal terminal 12 may be clamped.

Figure 7:
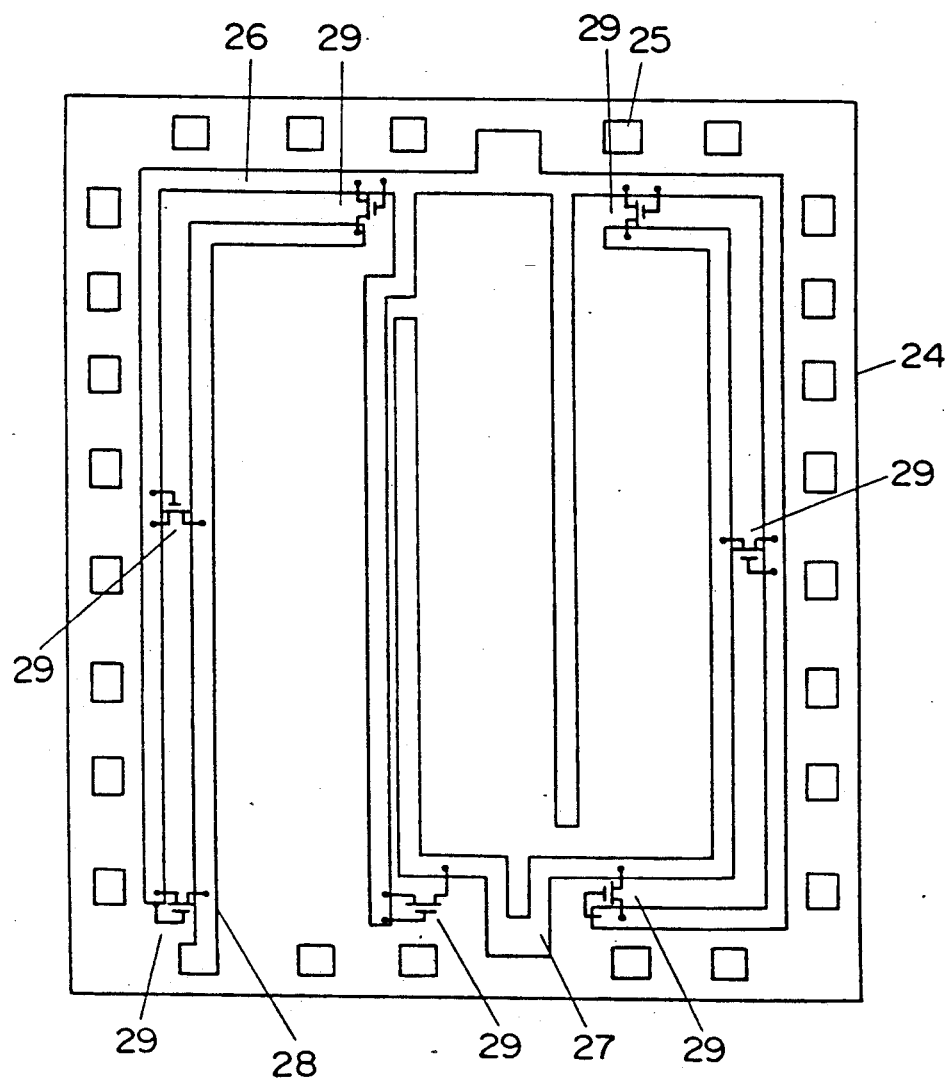
FIG. 7 is a plan view of a semiconductor chip incorporating a surge protection apparatus in accordance with a sixth embodiment of the present invention.

FIG. 7 is a plan view of a semiconductor chip incorporating a surge protection apparatus in accordance with a sixth embodiment of the present invention.

In FIG. 7, multiple input, output pads 25 are formed in the peripheral regions of a semiconductor chip 24. Each one of the input, output pads corresponds to the signal terminal shown in FIG. 1 and others. Although not shown in FIG. 7, first and second diodes (13 and 14 in FIG. 1) for surge protection are connected to the input, output pads 25, and they are also connected to the internal circuit (1 in FIG. 1) through the signal wires. Inside of each one of the input, output pads 25, a ground wire (a negative power supply wire) 26 which is partly connected to one of the input, output pads 25 is formed. The ground wire 26 corresponds to the negative power supply terminal 5 in FIG. 1. Inside the ground wire 26, Vcc wires (positive power supply wires) 27 and 28 are formed at a specific interval from the ground wire 26. These Vcc wires 27 and 28 are equivalent to the positive power supply terminal 4 in FIG. 1. Each one of Vcc wires 27 and 28 is connected to one of the input, output pads 25. In FIG. 7, incidentally, the plural Vcc wires 27 and 28 are formed in order to selectively drive the plural circuit blocks formed in the semiconductor chip 24 so as to reduce the total power consumption, but this composition itself is not related to the nature of the invention. Besides, plural protective elements 29 are connected between the Vcc wires 27 and 28, and the ground wire 26, near the input, output pads 25. These protective elements 29 correspond to the protective transistors 19, 22, 23 in FIG. 1 to FIG. 6. What is characteristic in the embodiment in FIG. 7 is that plural protective elements 29 connected between a pair of power supply wires are disposed sporadically.

When the chip area of the semiconductor chip 24 increases, generally, the power supply wires 26, 27, 28 become longer, and the power supply wire impedance increases, so that the surge protective effect decreases. Therefore, as in the embodiment shown in FIG. 7, when the protective elements 29 are scattered about the input voltage is clamped several times in the course of the long power supply wiring, deterioration of the protective effect due to the power supply wire impedance may be prevented.

Figure 8:
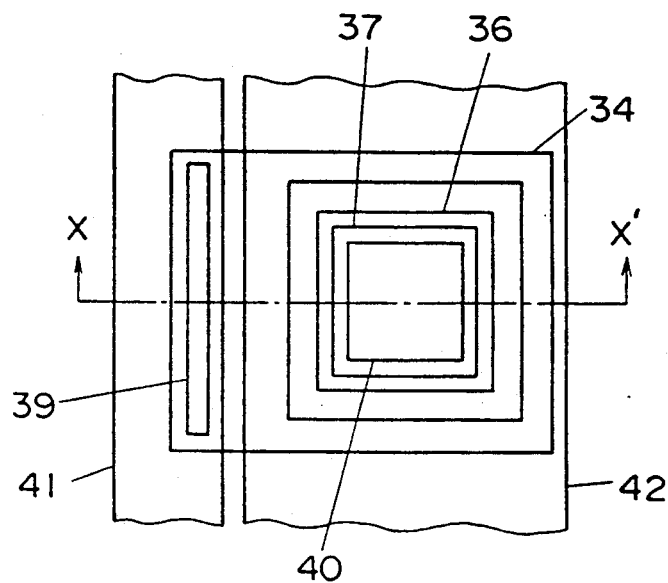
FIG. 8 is a plan view showing essential part of a surge protection apparatus in accordance with a seventh embodiment of the present invention.
Figure 9:
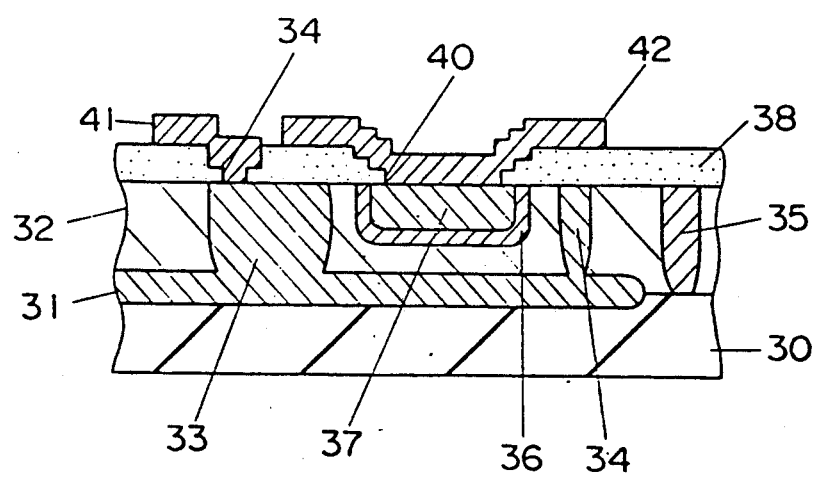
FIG. 9 is a sectional view of line X—X' in FIG. 8.
Figure 10:
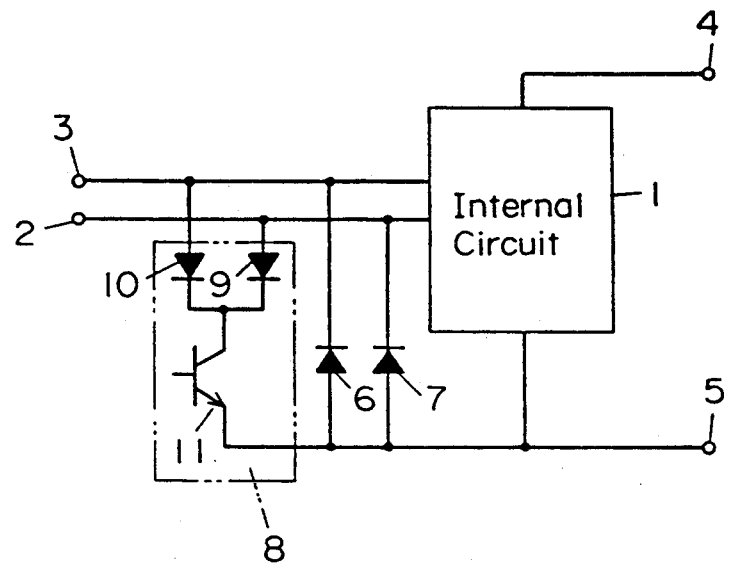
FIG. 10 is a circuit diagram of a conventional surge protection apparatus.
Figure 11:
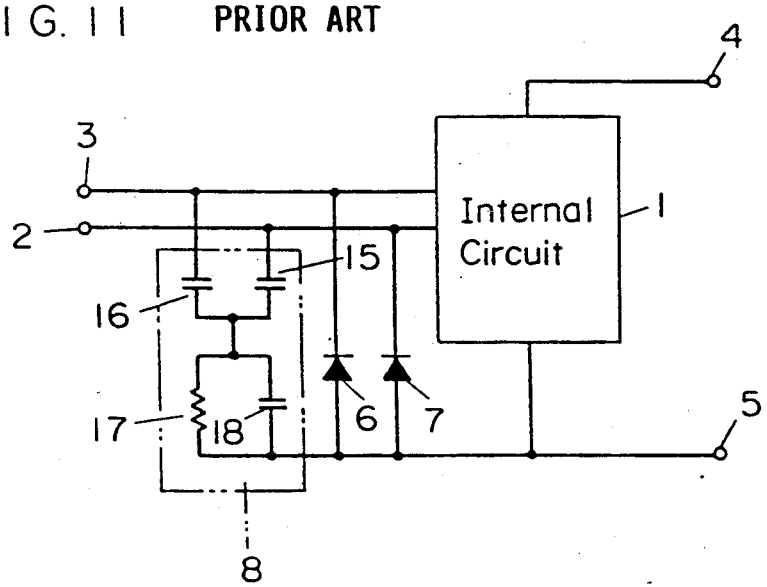
FIG. 11 is an equivalent circuit diagram of FIG. 10.

FIG. 8 is a plan view of a surge protection apparatus in accordance with a seventh embodiment of the present invention, and FIG. 9 is a sectional view of line X—X' in FIG. 8. In FIG. 8, FIG. 9, a collector region 31 and an epitaxial layer 32 are formed in a semiconductor substrate 30, and collector walls 33 and 34 and separation region 35 are formed in the epitaxial layer 32. In the epitaxial layer 32 surrounded by the collector walls 33, 34, a base region 36 and an emitter region 37 are formed. On the surface of the epitaxial layer 32, an insulation film 38 is formed. Contact windows 39 and 40 are formed in the insulation film 38. On the insulation film 38 and Vcc wire 41 and ground wire 42 are formed, and they are connected respectively to the collector region 31 and emitter region 37 through contact windows 39 and 40. In this constitution, the protective transistor 19 and its connection to the power supply terminals 4 and 5 as shown in the embodiment in FIG. 1 are realized.

Generally, in a semiconductor chip having a wide chip area, the power supply wires are formed in a broad width of about 30 to 100 μm in order to decrease the power supply wiring impedance. Accordingly, as shown in FIG. 8 and FIG. 9, immediately beneath the wider power supply wires 41 and 42, a protective transistor is formed in the semiconductor substrate 30, and the collector and emitter regions are respectively connected to the power supply wires 41 and 42.

As a result, the protective transistor may be formed by taking advantage of the dead space beneath the power supply wires. Therefore, the chip area hardly increases even if plural protective transistors 29 are formed in the semiconductor chip 24 as shown in the embodiment in FIG. 7.

Meanwhile, in any one of the foregoing embodiments, the effects of the invention are not changed, needless to say, if the first and second diodes 13 and 14 are composed of so-called diode-connected transistors.

We claim:

1. A surge protection apparatus for protecting an internal circuit composed of MOS semiconductor elements comprising:

a signal terminal, a first power supply terminal and second power supply terminal connected to the internal circuit;

a first diode having an anode which is connected to said signal terminal and having a cathode which is connected to said first power supply terminal;

a second diode having a cathode which is connected to said signal terminal and having an anode which is connected to said second power supply terminal; and a protective MOS transistor having a drain electrode which is connected to said first power supply terminal, and having a source electrode which is connected to said second power supply terminal and having a gate electrode which is connected to said source electrode.

2. A surge protection apparatus for protecting an internal circuit formed in a semiconductor chip comprising:
   plural signal input/output pads and power supply pads formed in a peripheral region of the semiconductor chip;
   first and second power supply wires connected to said power supply pads and disposed mutually adjacent to each other on the semiconductor chip;
   a means for respectively connecting said plural signal input/output pads and said first and second power supply wires to the internal circuit;
   plural first and second diodes, each of said first and second diodes respectively connected between said signal input/output pads and said first and second power supply wires; and
   plural protective transistors connected between said first and second power supply wires and disposed sporadically at plural positions along a longitudinal direction of said first and second power supply wires.

3. A surge protection apparatus as recited in claim 2, wherein said protective transistor is formed in the semiconductor substrate beneath said first or second power supply wire.

* * * * *